United States Patent
Han et al.

(10) Patent No.: US 12,394,837 B2
(45) Date of Patent: Aug. 19, 2025

(54) IMMERSION COOLING SYSTEM INCLUDING METAL-ENCASED, POUCH-TYPE BATTERY CELLS FOR HOT GAS FLOW SEPARATION IN BATTERY SYSTEMS OF ELECTRIC VEHICLES

(71) Applicant: GM GLOBAL TECHNOLOGY OPERATIONS LLC, Detroit, MI (US)

(72) Inventors: Taeyoung Han, Bloomfield Hills, MI (US); Chih-hung Yen, Bloomfield Hills, MI (US); Ryan Patrick Hickey, Austin, TX (US); Matthew Swift, Detroit, MI (US); William Yu Chen, Troy, MI (US); Goro Tamai, Bloomfield Hills, MI (US); Bahram Khalighi, Holladay, UT (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/743,630

(22) Filed: May 13, 2022

(65) Prior Publication Data
US 2023/0369678 A1    Nov. 16, 2023

(51) Int. Cl.
*H01M 10/6567* (2014.01)
*H01M 10/613* (2014.01)
(Continued)

(52) U.S. Cl.
CPC ..... *H01M 10/6567* (2015.04); *H01M 10/613* (2015.04); *H01M 10/647* (2015.04);
(Continued)

(58) Field of Classification Search
CPC .......... H01M 10/6567; H01M 10/613; H01M 10/647; H01M 10/658; H01M 50/105;
(Continued)

(56) References Cited

U.S. PATENT DOCUMENTS

| 8,785,024 B2 | 7/2014 | Han et al. |
| 8,968,904 B2 | 3/2015 | Han et al. |

(Continued)

FOREIGN PATENT DOCUMENTS

| DE | 102009043858 A1 | 3/2010 |
| DE | 102018133004 A1 * | 6/2020 |

(Continued)

OTHER PUBLICATIONS

Machine translation of DE-102018133004-A1 (Year: 2023).*

(Continued)

*Primary Examiner* — Milton I Cano
*Assistant Examiner* — Albert Michael Hilton (57) ABSTRACT

An immersion cooling system for a battery system includes a battery enclosure and C metal-encased, pouch-type battery cells including C metal cases, C pouch-type battery cells arranged in the C metal cases, respectively, where C is an integer greater than one, and C vents on the C metal cases, respectively. A vent gas manifold is in fluid communication with the C vents of the C metal cases and is configured to remove vent gas passing through the C vents of the C metal cases from the battery enclosure.

24 Claims, 7 Drawing Sheets

(51) Int. Cl.
  *H01M 10/647* (2014.01)
  *H01M 10/658* (2014.01)
  *H01M 50/105* (2021.01)
  *H01M 50/119* (2021.01)
  *H01M 50/211* (2021.01)
  *H01M 50/375* (2021.01)
  *H05K 7/20* (2006.01)

(52) U.S. Cl.
  CPC ....... *H01M 10/658* (2015.04); *H01M 50/105* (2021.01); *H01M 50/119* (2021.01); *H01M 50/211* (2021.01); *H01M 50/375* (2021.01); *H05K 7/20236* (2013.01); *H05K 7/20272* (2013.01)

(58) Field of Classification Search
  CPC ............. H01M 50/211; H01M 50/119; H01M 50/375; H05K 7/20272; H05K 7/20236
  See application file for complete search history.

(56) References Cited

U.S. PATENT DOCUMENTS

| | | |
|---|---|---|
| 9,196,935 B2 | 11/2015 | Han et al. |
| 11,316,217 B2 | 4/2022 | Warey et al. |
| 2011/0244294 A1 | 10/2011 | Han et al. |
| 2013/0236754 A1* | 9/2013 | Lim ...................... H01M 50/30 429/82 |
| 2015/0147633 A1* | 5/2015 | Ahn ..................... H01M 50/548 429/176 |
| 2015/0180095 A1 | 6/2015 | Chen et al. |
| 2019/0090383 A1* | 3/2019 | Tufty ................. H05K 7/20263 |
| 2020/0067037 A1* | 2/2020 | Zeng ................... H01M 50/211 |
| 2020/0266506 A1* | 8/2020 | Stuetz ............... H01M 10/6568 |
| 2021/0098842 A1* | 4/2021 | Nowak ................. H01M 50/24 |
| 2021/0159473 A1 | 5/2021 | Han et al. |
| 2021/0376411 A1 | 12/2021 | Yen et al. |
| 2021/0384567 A1* | 12/2021 | Hom .................... H01M 10/659 |
| 2022/0013849 A1* | 1/2022 | Zeng ................... H01M 50/375 |

FOREIGN PATENT DOCUMENTS

| | | | | |
|---|---|---|---|---|
| DE | 102018221472 A1 | * | 6/2020 | ......... H01M 10/613 |
| KR | 20170043926 | * | 4/2017 | |

OTHER PUBLICATIONS

Machine translation of KR20170043926 (Year: 2024).*
Machine translation of DE-102018221472-A1 (Year: 2025).*
U.S. Appl. No. 17/074,541, filed Oct. 19, 2020, Han et al.
U.S. Appl. No. 17/350,350, filed Jun. 17, 2021, Yen et al.
U.S. Appl. No. 17/375,491, filed Jul. 14, 2021, Han et al.
U.S. Appl. No. 17/396,245, filed Aug. 6, 2021, Yen et al.

* cited by examiner

IMMERSION COOLING SYSTEM INCLUDING METAL-ENCASED, POUCH-TYPE BATTERY CELLS FOR HOT GAS FLOW SEPARATION IN BATTERY SYSTEMS OF ELECTRIC VEHICLES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery systems, and more particularly to immersion cooling systems for battery systems of electric vehicles.

Electric vehicles (EVs) such as battery electric vehicles (BEV), fuel cell vehicles or hybrid vehicles include a battery system with one or more battery cells, modules and/or packs. A power control system controls charging and/or discharging of the battery system during charging, regeneration and/or driving. During driving, one or more electric motors of the EV receive power from the battery system to provide propulsion for the vehicle and/or to return power to the battery system during regeneration and/or charging from a utility.

During operation, power is delivered by the battery system to the motor(s) and returned by the motor(s) to the battery system using one or more components such as power inverters, DC-DC converters and/or other components. The battery system is designed to deliver high power when requested, absorb high power quickly during charging from the utility and/or to absorb high power during regeneration.

The battery systems are expected to continue to increase in power density and operate at higher voltage levels. When operating under these conditions, significant heating of the battery cells, the battery modules, the battery pack, the power inverters, the DC-DC converters and/or other EV components can occur.

SUMMARY

An immersion cooling system for a battery system includes a battery enclosure and C metal-encased, pouch-type battery cells including C metal cases, C pouch-type battery cells arranged in the C metal cases, respectively, where C is an integer greater than one, and C vents on the C metal cases, respectively. A vent gas manifold is in fluid communication with the C vents of the C metal cases and is configured to remove vent gas passing through the C vents of the C metal cases from the battery enclosure.

In other features, a first liquid manifold is configured to supply dielectric fluid to the battery enclosure to immerse the C metal-encased, pouch-type battery cells. A second liquid manifold is configured to receive dielectric fluid from the battery enclosure.

In other features, the C pouch-type battery cells include first and second connecting tabs extending from longitudinal ends thereof. The C metal cases include first and second openings to receive the first and second connecting tabs of the C pouch-type battery cells, respectively.

In other features, a plurality of insulating members arranged between adjacent ones of the C metal-encased, pouch-type battery cells. A plurality of spacer members arranged between adjacent ones of the C metal-encased, pouch-type battery cells.

In other features, each of the plurality of spacer members includes a plurality of vertical members arranged horizontally spaced from one another between adjacent ones of the C metal-encased, pouch-type battery cells. A thermal insulating layer is arranged on the C metal cases around the C vents.

In other features, the vent gas manifold is arranged in the battery enclosure on the thermal insulating layer above the C vents of the C metal cases. In other features, the vent gas manifold includes C vent openings that align with the C vents of the C metal cases, respectively, when installed in the battery enclosure. In other features, the vent gas manifold includes an open bottom surface in fluid communication with the C vents of the C metal cases when installed in the battery enclosure.

An immersion cooling system for a battery system includes a battery enclosure, C metal-encased, pouch-type battery cells including C metal cases, C pouch-type battery cells arranged in the C metal cases, respectively, where C is an integer greater than one. Each of the C pouch-type battery cells includes first and second connecting tabs extending from longitudinal ends thereof. The C metal-encased, pouch-type battery cells include C vents on the C metal cases, respectively, and first and second openings on the C metal cases configured to receive the first and second connecting tabs of the C pouch-type battery cells, respectively, and a thermal insulating layer arranged on the C metal cases around the C vents of C metal cases. A vent gas manifold in fluid communication with the C vents of the C metal cases is configured to remove vent gas passing through the C vents of the C metal cases from the battery enclosure.

In other features, a first liquid manifold to supply dielectric fluid to the battery enclosure to immerse the C metal-encased, pouch-type battery cells. A second liquid manifold is configured to receive dielectric fluid from the battery enclosure. A plurality of insulating members are arranged between adjacent ones of the C metal-encased, pouch-type battery cells. A plurality of spacer members are arranged between adjacent ones of the C metal-encased, pouch-type battery cells. Each of the plurality of spacer members includes a plurality of vertical members arranged horizontally spaced from one another between adjacent ones of the C metal-encased, pouch-type battery cells.

A method for cooling a battery system includes providing C metal-encased, pouch-type battery cells by: providing C metal cases each including a vent and first and second openings; arranging C pouch-type battery cells in the C metal cases, respectively, where C is an integer greater than one, wherein the first and second openings of the C metal cases receive connecting tabs of the C pouch-type battery cells; and arranging the C metal-encased, pouch-type battery cells in a battery enclosure. The method includes arranging a vent gas manifold in fluid communication with the vent of each of the C metal cases; and removing vent gas passing through the vent of each of the C metal cases from the battery enclosure via the vent gas manifold.

In other features, the method include supplying dielectric fluid to the battery enclosure to immerse the C metal-encased, pouch-type battery cells. The method includes arranging a plurality of insulating members between adjacent ones of the C metal-encased, pouch-type battery cells. The method includes arranging a plurality of spacer members between adjacent ones of the C metal-encased, pouch-type battery cells. Each of the plurality of spacer members includes a plurality of vertical members arranged horizontally spaced from one another between adjacent ones of the C metal-encased, pouch-type battery cells.

The method includes arranging a thermal insulating layer on the C metal cases around the vent of each of the C metal cases.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

As described above, the power density and operating voltage of battery systems for EVs has increased significantly. Heating of EV components such as the battery cells, the battery module(s), the battery pack(s), the power inverter (s), the DC-DC converter(s) and/or other EV component(s) may occur during charging or operation.

Heating of the battery cells above a predetermined temperatures tends to accelerate wear and/or failure of the battery cells. Battery cells can fail due to several different reasons including decomposition, reaction between lithium (Li) and solvent at the anode, electrolyte decomposition, cathode decomposition, internal shorts due to separator breakdown, and rapid oxidation-reduction reactions between the cathode and the anode.

In some examples, DC fast charging (DCFC) systems may be used to charge the battery quickly, which may heat the EV components. Cooling systems are used to maintain the battery components below the predetermined temperature to ensure optimal performance and/or to prevent premature damage/wear due to excessive operating temperatures. For example, excessive heating of the battery cells may cause a condition called thermal runaway.

As a battery cell begins to fail, hot gas/particles are emitted by the battery cell. The hot gas/particles from the failed battery cell can cause heat transfer to other adjacent battery cells. As the adjacent battery cells are heated, they too can fail and cause further failures or propagation.

An immersion cooling system according to the present disclosure prevents hot gas from heating neighboring battery cells by arranging pouch-type battery cells in metal cases with vents and managing vent gas generated by each of the battery cells to prevent the vent gas from causing further battery cell failures due to overheating. In other words, the immersion cooling system prevents hot gas convection to neighboring battery cells to prevent thermal runaway propagation.

The immersion cooling system according to the present disclosure has improved cooling performance that enables DC fast charging while protecting battery life. The battery cooling system also provides effective cooling of a bus bar/connector/tab. The improved cooling tends to reduce the likelihood of an initial thermal runaway event. When one of the battery cells experiences a thermal runaway event, the immersion cooling system prevents thermal runaway propagation. In some examples, dielectric liquid has fire suppression characteristics that improved safety. The immersion cooling system according to the present disclosure allows release of vent gas without loss of dielectric fluid.

Figure 1:
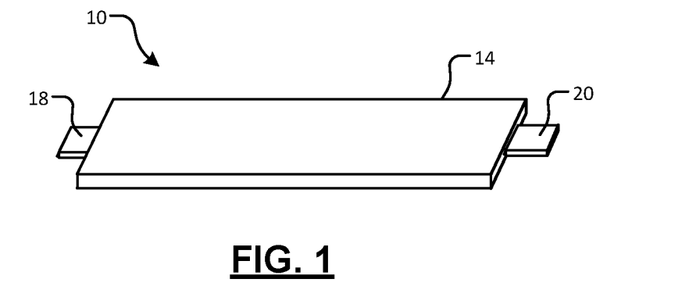
FIG. 1 is a perspective view of an example of a pouch-type battery cell for a battery system.
Figure 2:
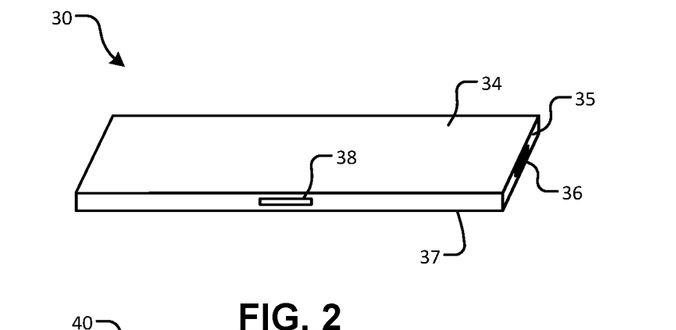
FIG. 2 is a perspective view of an example of a metal case for a pouch-type battery cell according to the present disclosure.

Referring now to FIGS. 1-4, a metal-encased, pouch-type battery cell for a battery system is shown. In FIG. 1, a pouch-type battery cell 10 is shown to include a pouch-type enclosure 14 and connecting tabs 18, 20 extending from opposite longitudinal ends of the pouch-type enclosure 14. In FIG. 2, a metal case 30 is configured to enclose the pouch-type battery cell 10. The metal case 30 includes an inner cavity to receive the pouch-type battery cell 10, side surfaces 34, end edges 35 and side edges 37. A vent 38 is located along one of the side edges 37 to direct and control a location and path of the vent gas as it is directed out of the battery enclosure 113. Openings 36 are located along the end edges 35 to allow the connecting tabs 18, 20 to pass through the metal case 30.

Figure 3:
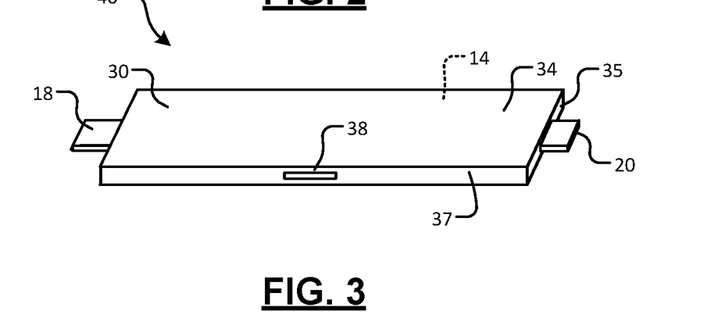
FIG. 3 is perspective view of an example of a metal-encased, pouch-type battery cell according to the present disclosure.
Figure 4:
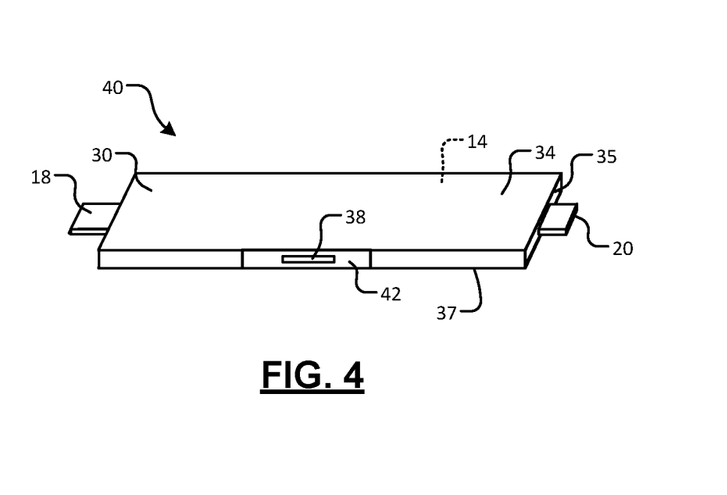
FIG. 4 is perspective view of an example of a metal-encased, pouch-type battery cell with a thermal barrier layer around a vent according to the present disclosure.

In FIG. 3, a metal-encased, pouch-type battery cell 40 includes the pouch-type battery cell 10 installed in the metal case 30 with the connecting tabs 18, 20 extending through the openings 36. In FIG. 4, a thermal barrier layer 42 is arranged around the vent 38. In some examples, the thermal barrier layer 42 includes tape. In some examples, the thermal barrier layer 42 may extend onto the side surfaces 34.

Figure 5:
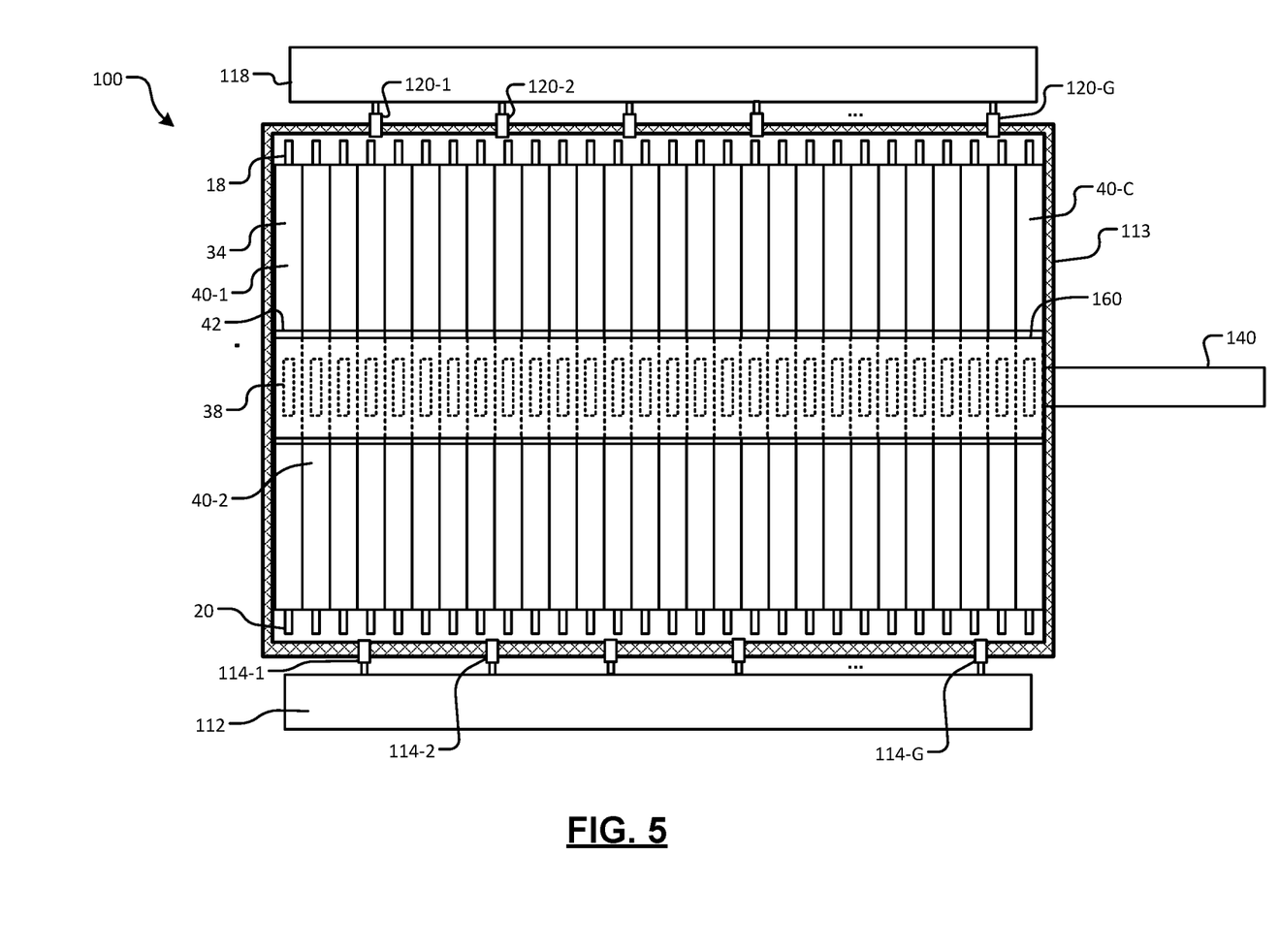
FIG. 5 is a plan view of an example of an immersion cooling system including metal-encased, pouch-type battery cells according to the present disclosure.

Referring now to FIG. 5, an immersion cooling system 100 including the metal-encased, pouch-type battery cells 40-1, 40-2, . . . , and 40-C (collectively and individually metal-encased, pouch-type battery cell(s) 40) is shown. In this example, the side surfaces of the metal-encased, pouch-type battery cells 40 are arranged in direct contact with adjacent ones of the metal-encased, pouch-type battery cells 40.

A liquid manifold 112 supplies dielectric fluid via one or more conduits and/or connectors 114-1, 114-2, . . . , and 114-G to a battery enclosure 113 to immerse the metal-encased, pouch-type battery cells 40, where G is an integer greater than zero. A liquid manifold 118 evacuates dielectric fluid from the battery enclosure 113 via conduits and/or connectors 120-1, 120-2, . . . and 120-H, where H is an integer greater than zero and where H>G, H<G or H=G. In some examples, a pump and dielectric fluid source (not shown) may be used to supply or remove the dielectric fluid from the battery enclosure 113 (e.g. a cooling loop). While the liquid manifolds are shown connected to sides of the battery enclosure, the liquid manifolds can be connected to longitudinal ends of the manifolds.

A vent gas manifold 160 is arranged on a top surface of the metal-encased, pouch-type battery cells 40 and transversely relative to a longitudinal direction of the metal-encased, pouch-type battery cells 40. The vent gas manifold 160 receives vent gases flowing out of the vents 38 and directs the vent gases away from the metal-encased, pouch-type battery cells 40 and the dielectric fluid and out of the battery enclosure 113. Upper portions of the metal-encased, pouch-type battery cells 40 are protected from high temperatures of the vent gases by the thermal barrier layer 42. A gas conduit 140 may be connected to an outlet of the vent gas manifold 160 to direct the vent gases to another location.

Significant cooling of the battery cells can be performed by flowing dielectric fluid around exposed surfaces of the battery cells. In this example, the exposed surfaces of the battery cells are predominantly the edges of the battery cells. However, both the edges and the faces can be cooled as described further below.

Figure 6A:
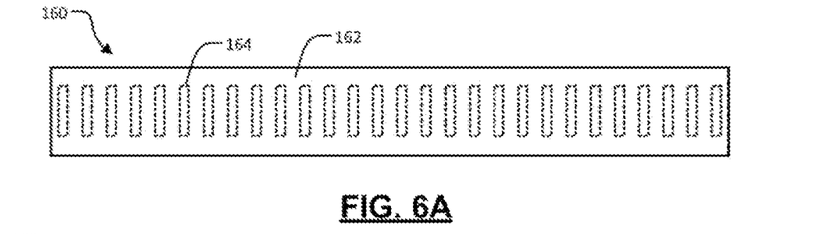
FIG. 6A is a top view of an example of a gas manifold according to the present disclosure.
Figures 6B, 6C, 7C:
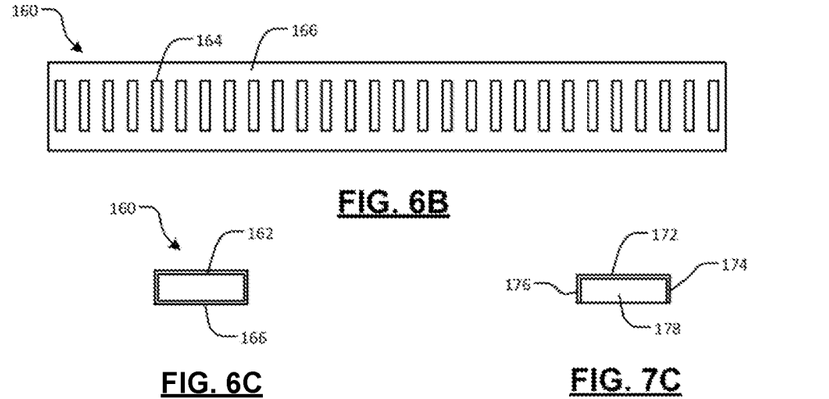
FIG. 6B is a bottom view of the vent gas manifold of FIG. 6A.
FIG. 6C is an end view of the vent gas manifold of FIG. 6A.
FIG. 7C is an end view of the vent gas manifold of FIG. 7A.
Figure 8A:
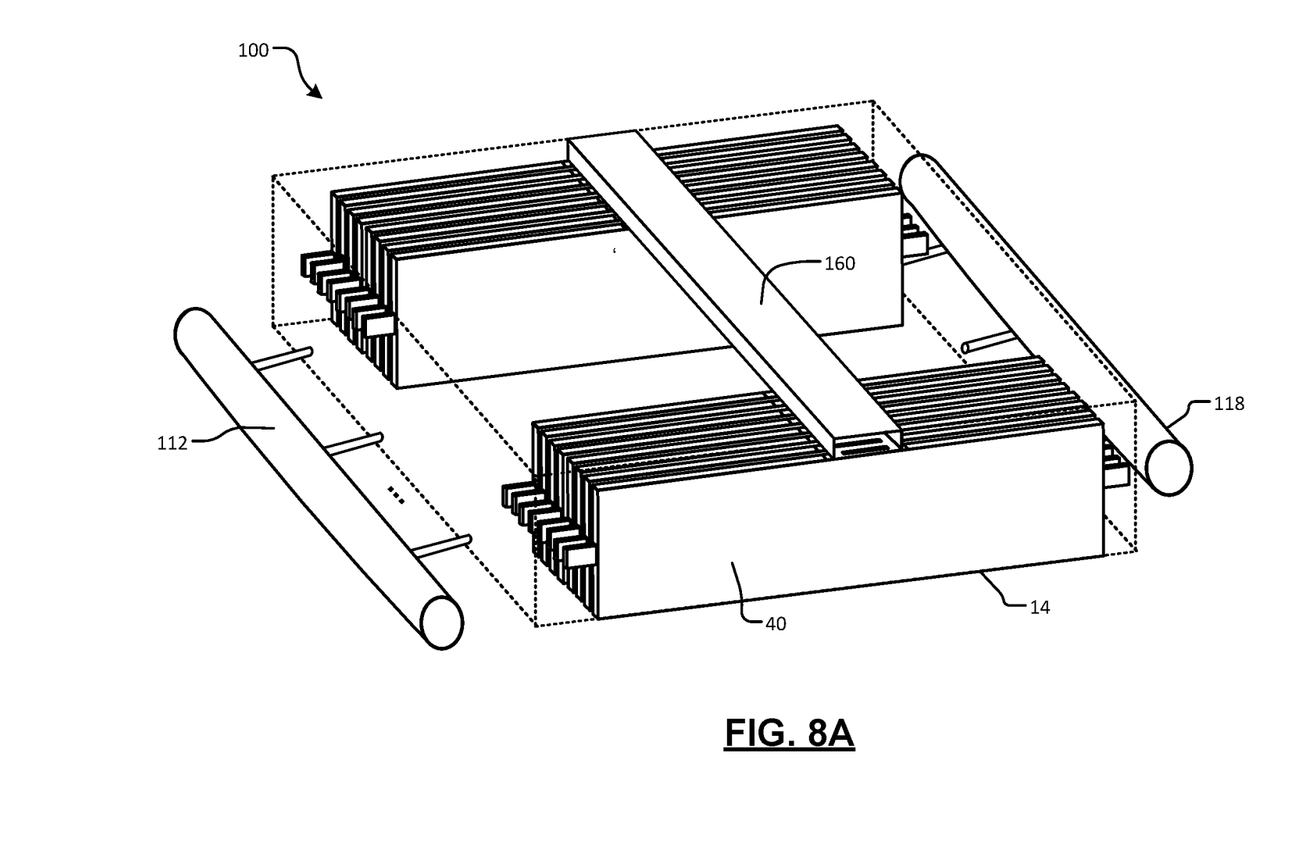
FIG. 8A is a perspective view of another example of the immersion cooling system including the vent gas manifold of FIGS. 6A and 6B arranged on a top surface of the metal-encased, pouch-type battery cells in the battery enclosure according to the present disclosure.

Referring now to FIGS. 6A, 6B and 8A, the vent gas manifold 160 is shown in further detail. The vent gas manifold 160 includes a top side 162 and manifold openings 164 on a bottom surface 166 thereof. The manifold openings 164 align with the vents 38 of the metal-encased, pouch-type battery cells 40 when installed in the battery enclosure 113. Vent gas flowing from the vents 38 of the metal-encased, pouch-type battery cells 40 flows through the manifold openings 164 into the vent gas manifold 160. The vent gas manifold 160 directs the vent gases away from adjacent ones of the metal-encased, pouch-type battery cells 40, the dielectric fluid, and out of the battery enclosure. As can be appreciated, one or both ends of the vent gas manifold can be blocked or open to a conduit or another type of gas connection can be used.

Figure 7A:
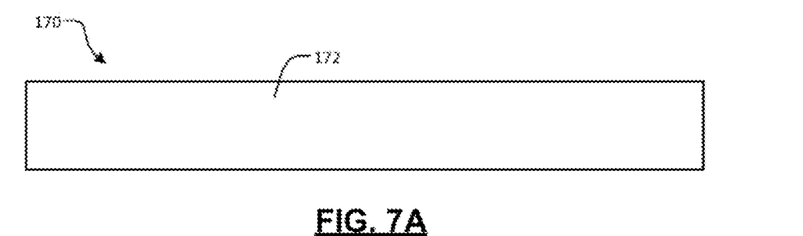
FIG. 7A is a top view of another example of a vent gas manifold according to the present disclosure.
Figure 7B:
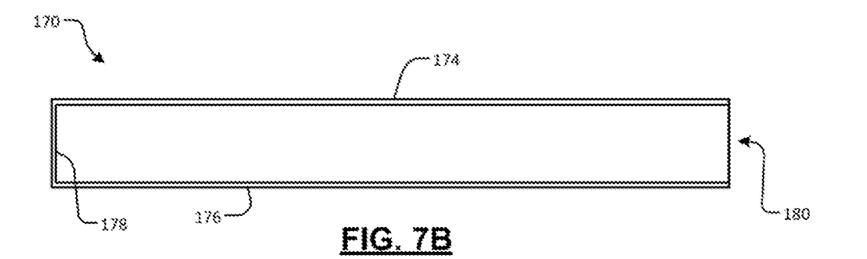
FIG. 7B is a bottom view of another example of the vent gas manifold in FIG. 7A.
Figure 8B:
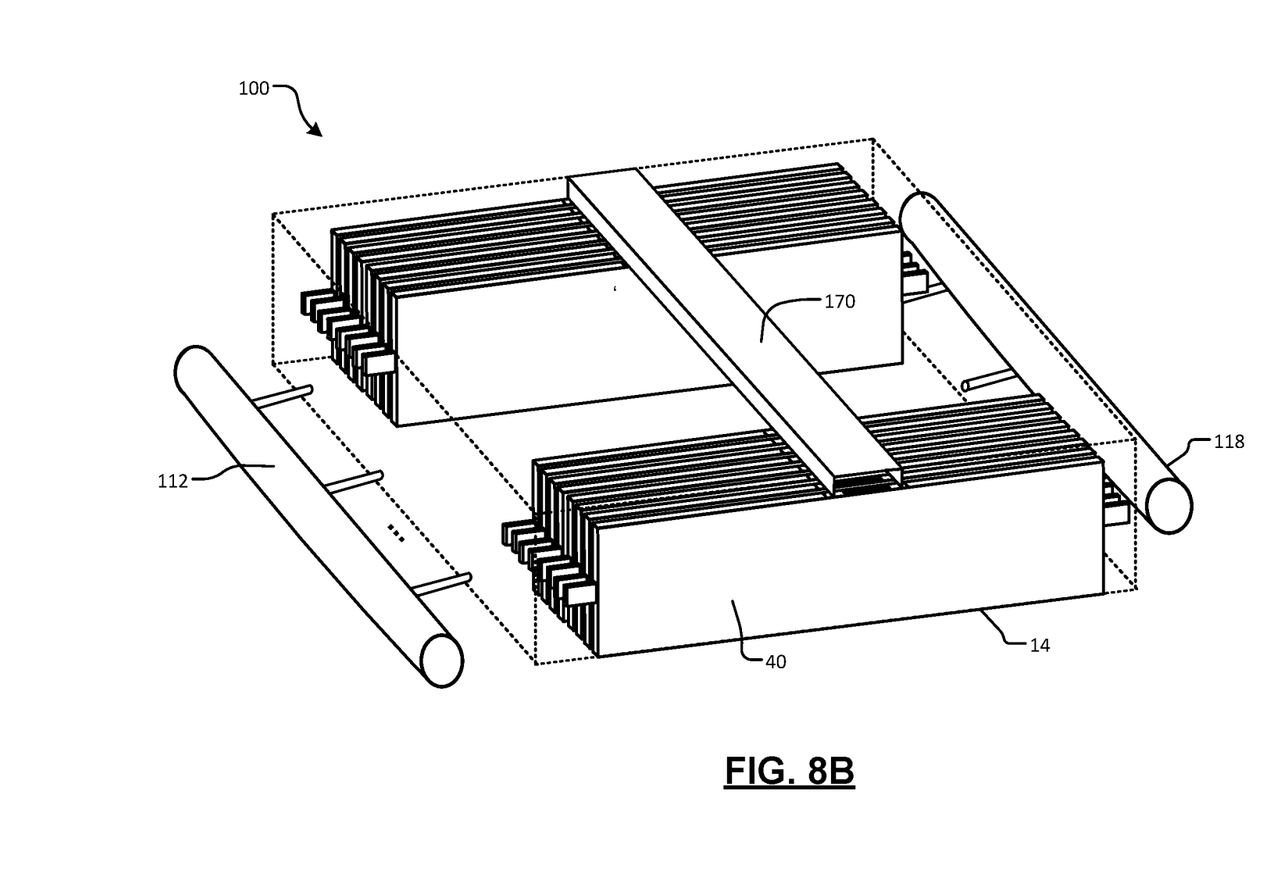
FIG. 8B is a perspective view of another example of the immersion cooling system including the vent gas manifold of FIGS. 7A and 7B arranged on the top surface of the metal-encased, pouch-type battery cells in the battery enclosure according to the present disclosure.

Referring now to FIGS. 7A, 7B, and 8B, the vent gas manifold 170 is shown in further detail. The vent gas manifold 170 includes a top side 172, side surfaces 174, 176, and one or more end walls 178. Vent gas flowing from the metal-encased, pouch-type battery cells 40 flows into the vent gas manifold 170. The vent gas manifold 170 directs the vent gases away from adjacent ones of the metal-encased, pouch-type battery cells 40 and the dielectric fluid and out of the battery enclosure 113. As can be appreciated, one or both ends of the vent gas manifold 170 can be blocked or open to a conduit or another type of gas connection can be used.

Figure 9:
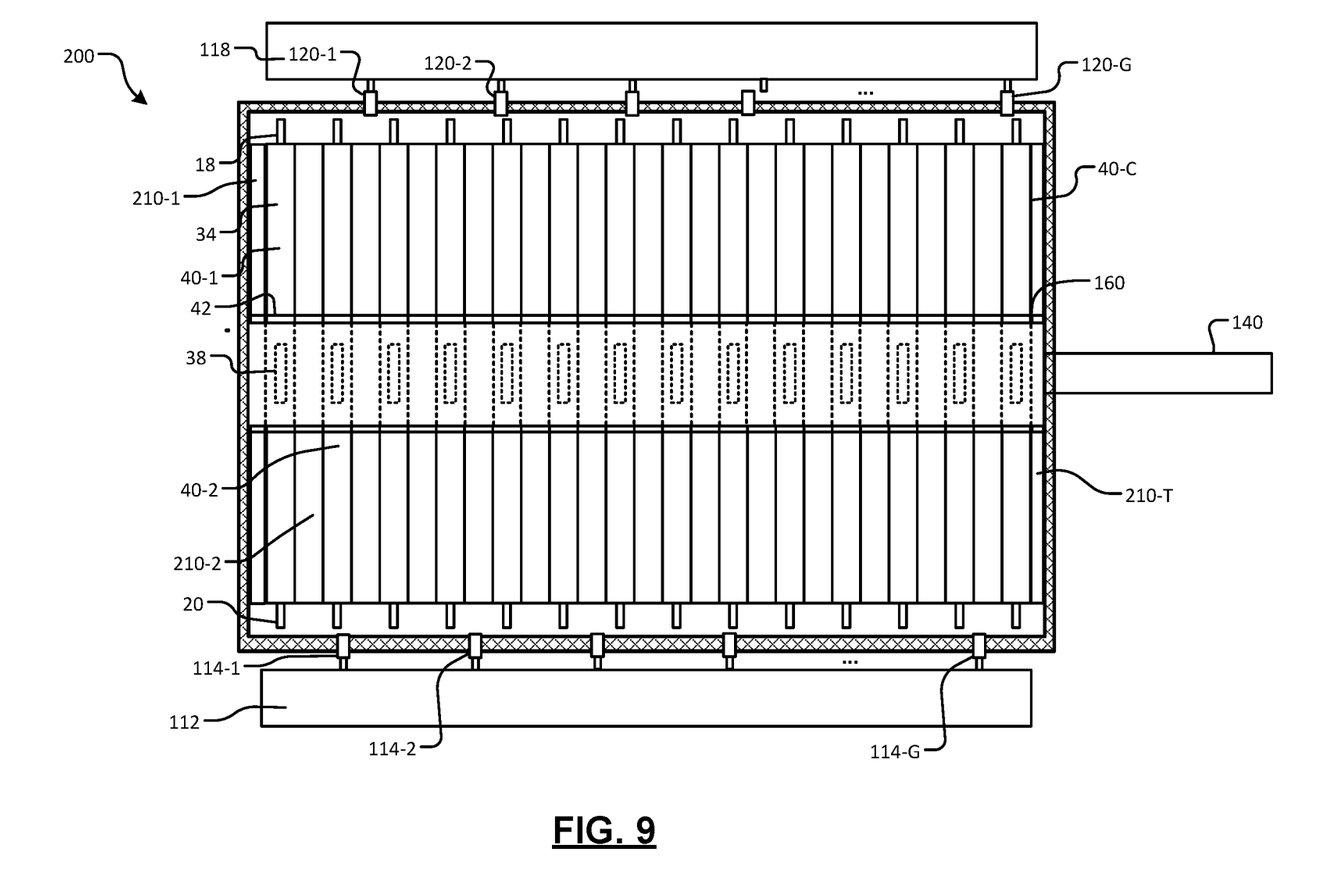
FIG. 9 is a plan view of another example of an immersion cooling system including metal-encased, pouch-type battery cells with insulating members located therebetween according to the present disclosure.

Referring now to FIG. 9, an immersion cooling system 200 includes insulating members 210-1, 210-2, . . . , and 210-T installed between adjacent ones of the metal-encased, pouch-type battery cells 40.

Figure 10:
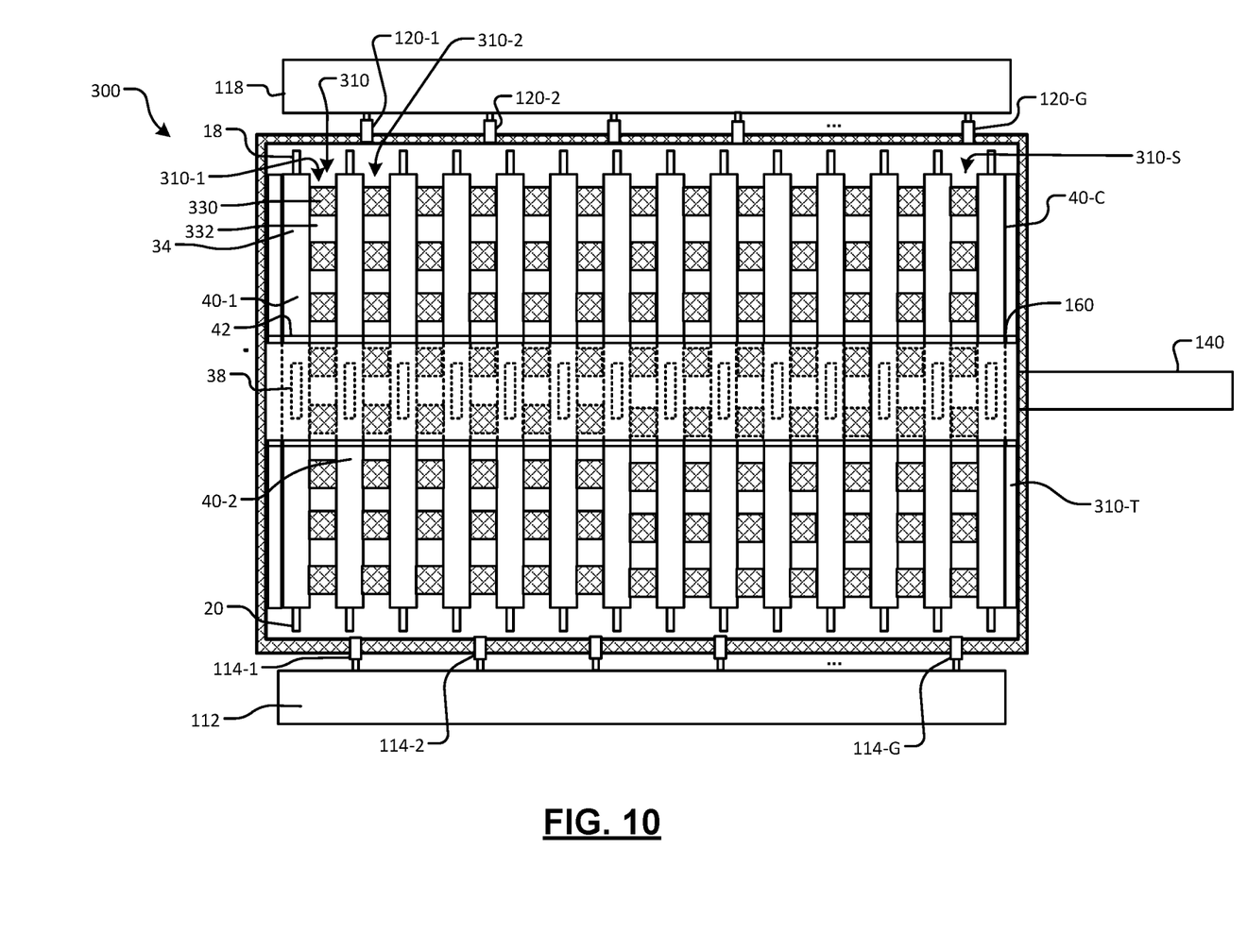
FIG. 10 is a plan view of another example of an immersion cooling system including metal-encased, pouch-type battery cells with insulating spacer members located therebetween according to the present disclosure.

Referring now to FIG. 10, an immersion cooling system 300 includes insulating spacer members 310-1, 310-2, . . . , and 310-S (collectively and individually insulating spacer members 310) installed between adjacent ones of the metal-encased, pouch-type battery cells 40 to prevent heat propagation. Each of the insulating spacer members 310-1, 310-2, . . . , and 310-S includes a plurality of vertical insulating members 330 that are horizontally spaced a predetermined distance from one another. In some examples, the plurality of vertical insulating members 330 are rectangular cube shaped. Spaces 332 between the insulating spacer members 310 allow dielectric fluid to flow along side surfaces of the metal-encased, pouch-type battery cells 40. In other words, both edge cooling and face cooling is performed.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:
1. An immersion cooling system for a battery system, comprising:
a battery enclosure;
C metal-encased, pouch-type battery cells distinct from and disposed in the battery enclosure and including:
C metal cases;
C pouch-type battery cells arranged in the C metal cases, respectively, where C is an integer greater than one; and
C vents on the C metal cases, respectively;
a vent gas manifold disposed in the battery enclosure, extending across the C metal cases, and in fluid communication with the C vents of the C metal cases and configured to remove vent gas passing from within the C metal cases, through the C vents of the C metal cases, through the vent gas manifold, and out the battery enclosure via an output of the vent gas manifold,
wherein the C vents are open to the vent gas manifold; and
a first liquid manifold configured to supply dielectric fluid to the battery enclosure and immerse the C metal-encased, pouch-type battery cells, wherein the C metal-encased, pouch-type battery cells are immersed in the dielectric fluid.

2. The immersion cooling system of claim 1, further comprising a second liquid manifold configured to receive the dielectric fluid from the battery enclosure via at least one of a plurality of conduits and a plurality of connectors extending through a side wall of the battery enclosure.

3. The immersion cooling system of claim 1, wherein:
the C pouch-type battery cells include first and second connecting tabs extending from longitudinal ends thereof; and
the C metal cases include first and second openings to receive the first and second connecting tabs of the C pouch-type battery cells, respectively.

4. The immersion cooling system of claim 1, further comprising a plurality of insulating members arranged between adjacent ones of the C metal-encased, pouch-type battery cells.

5. The immersion cooling system of claim 1, further comprising a plurality of spacer members arranged between adjacent ones of the C metal-encased, pouch-type battery cells,
wherein the plurality of spacer members provide spacing for the dielectric fluid to flow along side surfaces of the C metal-encased, pouch-type battery cells.

6. The immersion cooling system of claim 5, wherein each of the plurality of spacer members includes a plurality of vertical members arranged horizontally spaced from one another between adjacent ones of the C metal-encased, pouch-type battery cells.

7. The immersion cooling system of claim 1, further comprising a thermal insulating layer arranged on the C metal cases around the C vents.

8. The immersion cooling system of claim 7, wherein the vent gas manifold is arranged in the battery enclosure on the thermal insulating layer above the C vents of the C metal cases.

9. The immersion cooling system of claim 1, wherein the vent gas manifold includes C vent openings that align with the C vents of the C metal cases, respectively, when installed in the battery enclosure.

10. The immersion cooling system of claim 1, wherein the vent gas manifold includes an open bottom surface in fluid communication with the C vents of the C metal cases when installed in the battery enclosure.

11. An immersion cooling system for a battery system, comprising:
a battery enclosure;
C metal-encased, pouch-type battery cells including:
C metal cases disposed within the battery enclosure;
C pouch-type battery cells arranged in the C metal cases, respectively, where C is an integer greater than one, wherein each of the C pouch-type battery cells includes first and second connecting tabs extending from longitudinal ends thereof, and wherein each of the C pouch-type battery cells are encased in the C metal cases;
C vents on the C metal cases, respectively; and
first and second openings on the C metal cases configured to receive the first and second connecting tabs of the C pouch-type battery cells, respectively; and
a thermal insulating layer arranged on the C metal cases around the C vents of the C metal cases;
a vent gas manifold disposed within the battery enclosure external to the C metal cases and in fluid communication with the C vents of the C metal cases, wherein the vent gas manifold is configured to receive vent gas output from the C vents, and configured to remove the vent gas passing through the C vents of the C metal cases from the battery enclosure,
wherein the C vents are outputs of the C metal cases directing the vent gas of the C metal cases into the vent gas manifold, and
wherein the C vents are open to the vent gas manifold; and
a first liquid manifold configured to supply dielectric fluid to the battery enclosure and immerse the C metal-encased, pouch-type battery cells, wherein the C metal-encased, pouch-type battery cells are immersed in the dielectric fluid.

12. The immersion cooling system of claim 11, further comprising a second liquid manifold configured to receive dielectric fluid from the battery enclosure.

13. The immersion cooling system of claim 11, further comprising a plurality of insulating members arranged between adjacent ones of the C metal-encased, pouch-type battery cells.

14. The immersion cooling system of claim 11, further comprising a plurality of spacer members arranged between adjacent ones of the C metal-encased, pouch-type battery cells.

15. The immersion cooling system of claim 14, wherein each of the plurality of spacer members includes a plurality of vertical members arranged horizontally spaced from one another between and contacting adjacent ones of the C metal-encased, pouch-type battery cells.

16. A method for cooling a battery system, comprising:
providing a battery enclosure;
providing C metal-encased, pouch-type battery cells distinct from and disposed in the battery enclosure by:
providing C metal cases each including a vent and first and second openings;
arranging C pouch-type battery cells in the C metal cases, respectively, where C is an integer greater than one,
wherein the first and second openings of the C metal cases receive connecting tabs of the C pouch-type battery cells; and arranging the C metal-encased, pouch-type battery cells in the battery enclosure;

arranging a vent gas manifold in fluid communication with the vent of each of the C metal cases, wherein the vent gas manifold extends across the C metal cases, is in fluid communication with the vents of the C metal cases, and is configured to remove vent gas passing from within the C metal cases, through the vents of the C metal cases, through the vent gas manifold, and out the battery enclosure via an output of the vent gas manifold, and wherein the vents are open to the vent gas manifold;

removing vent gas passing through the vent of each of the C metal cases from the battery enclosure via the vent gas manifold; and supplying a dielectric fluid to the battery enclosure via a manifold and immersing the C metal-encased, pouch-type battery cells in the dielectric fluid.

17. The method of claim 16, further comprising:

arranging a plurality of spacer members between adjacent ones of the C metal-encased, pouch-type battery cells, wherein each of the plurality of spacer members includes a plurality of vertical members arranged horizontally spaced from one another between adjacent ones of the C metal-encased, pouch-type battery cells.

18. The immersion cooling system of claim 11, wherein the C pouch-type battery cells are entirely encased such that the C metal cases cover all of the C pouch-type battery cells except for the C vents and the first and second openings, which are sized to match sizes of the first and second connecting tabs, where the C vents are first holes in respective sidewalls of the C metal cases that are aligned with corresponding holes in the vent gas manifold.

19. The immersion cooling system of claim 1, wherein the vent gas manifold is a channel at least one of extending across and fluidically coupling the C vents of the C metal cases, and has fewer outputs than inputs.

20. The immersion cooling system of claim 1, wherein the vent gas manifold is implemented as a single channel that receives gases from the C vents.

21. The immersion cooling system of claim 1, wherein:

the C metal-encased, pouch-type battery cells comprise first and second openings on the C metal cases configured to receive first and second connecting tabs of the C pouch-type battery cells, respectively; and the C pouch-type battery cells are entirely encased such that the C metal cases cover all of the C pouch-type battery cells except for the C vents and the first and second openings, which are sized to match sizes of the first and second connecting tabs, where the C vents are first holes in respective sidewalls of the C metal cases that are aligned with corresponding holes in the vent gas manifold.

22. The immersion cooling system of claim 1, wherein the C vents do not close and are open to the vent gas manifold, which directs the vent gas away from adjacent ones of the C metal-encased, pouch-type battery cells, dielectric fluid in the battery enclosure, and out of the battery enclosure.

23. The immersion cooling system of claim 1, wherein each of the C metal-encased, pouch-type battery cells includes a first tab and a second tab extending respectively from longitudinal ends of a respective one of the C pouch-type battery cells and through respective openings in a respective one of the C metal cases.

24. The immersion cooling system of claim 23, wherein:

the first tabs and the second tabs extend between the longitudinal ends of the C pouch-type battery cells and two side walls of the battery enclosure, the two side walls being on opposite sides of the battery enclosure; and the first liquid manifold comprises at least one of a plurality of conduits and a plurality of connectors extending through one of the two side walls of the battery enclosure and to an area within the battery enclosure adjacent the first tabs.

\* \* \* \* \*